(12) United States Patent
Wako et al.

(10) Patent No.: US 7,271,836 B2
(45) Date of Patent: Sep. 18, 2007

(54) SOLID STATE IMAGE PICKUP DEVICE CAPABLE OF DRAINING UNNECESSARY CHARGE AND DRIVING METHOD THEREOF

(75) Inventors: Hideki Wako, Miyagi (JP); Katsumi Ikeda, Miyagi (JP); Tetsuo Yamada, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/287,280

(22) Filed: Nov. 28, 2005

(65) Prior Publication Data

US 2006/0077274 A1    Apr. 13, 2006

Related U.S. Application Data

(63) Continuation of application No. 09/983,119, filed on Oct. 23, 2001, now Pat. No. 7,050,101.

(30) Foreign Application Priority Data

Oct. 23, 2000  (JP)  ............................ 2000-322293

(51) Int. Cl.
*H04N 5/335* (2006.01)
*H01L 27/148* (2006.01)
*H01L 21/00* (2006.01)

(52) U.S. Cl. ...................... 348/314; 348/294; 257/230; 438/79

(58) Field of Classification Search ................ 348/294, 348/311, 312, 314, 315, 316; 257/225, 229, 257/230, 231, 232; 438/60, 75, 76, 78, 79, 438/80, 81; 250/208.1, 370.08

See application file for complete search history.

(56) References Cited

U.S. PATENT DOCUMENTS 5,589,698 A * 12/1996 Nakashiba ................... 257/231
6,215,521 B1 * 4/2001 Surisawa et al. ........... 348/314

FOREIGN PATENT DOCUMENTS

JP    5-183820    7/1993

* cited by examiner

*Primary Examiner*—Vivek Srivastava
*Assistant Examiner*—Justin P Misleh
(74) *Attorney, Agent, or Firm*—Arent Fox, LLP

(57) ABSTRACT

A drain region is formed along a horizontal charge transfer channel constituting a horizontal charge transfer element, and a barrier region for charges is formed between the horizontal charge transfer channel and drain region. A two-electrode element is formed by using the horizontal charge transfer channel, barrier region and drain region. A solid state image pickup device can be manufactured with high productivity, which device can drain charges in the horizontal charge transfer element at high speed.

6 Claims, 12 Drawing Sheets

F I G . 1
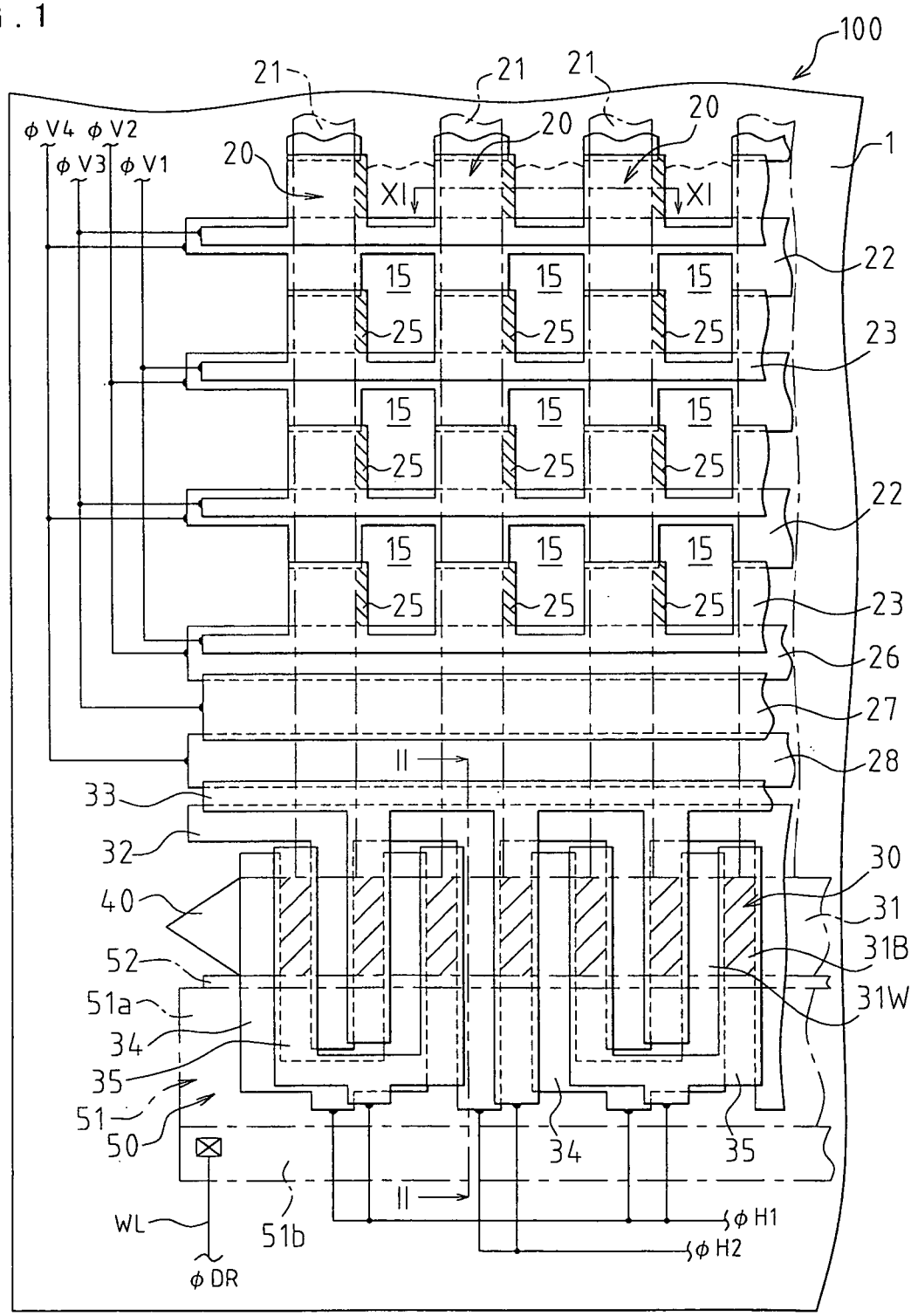

SOLID STATE IMAGE PICKUP DEVICE CAPABLE OF DRAINING UNNECESSARY CHARGE AND DRIVING METHOD THEREOF

This is a Continuation of application Ser. No. 09/983,119 filed Oct. 23, 2001, now U.S. Pat. No. 7,050,101. The disclosure of the prior application is hereby incorporated by reference herein in its entirety.

CROSS REFERENCE TO RELATED APPLICATION

This application is based on Japanese Patent Application 2000-322293, filed on Oct. 23, 2000, the whole contents of which are incorporated herein by reference.

BACKGROUND OF THE INVENTION

A) Field of the Invention

The present invention relates to a solid state image pickup device and its driving method, and more particularly to a solid state image pickup device having a horizontal charge transfer element capable of parallel receiving charges from a plurality of vertical charge transfer elements and serially outputting the charges, and to a method of driving such a solid state image pickup device.

B) Description of the Related Art

After establishment of mass production techniques of CCD's (charge coupled devices), image pickup apparatuses such as electronic still cameras and digital video cameras are rapidly prevailing, which apparatuses utilize CCD-type solid state image pickup devices as area image sensors.

In a CCD-type solid image pickup device, a number of photoelectric conversion elements are formed in a matrix shape in columns and rows in a photosensitive area defined in one surface of a semiconductor substrate. A photodiode is generally used as the photoelectric conversion element. The total number of photoelectric conversion elements in one solid state image pickup device is, for example, several hundred thousands to several millions.

A vertical charge transfer element (VCCD) is disposed near each photosensitive conversion element column. Charges accumulated in each photoelectric conversion element are read into the associated vertical charge transfer element which transfers the charges to a horizontal charge transfer element (HCCD) formed outside the photosensitive area. In this case, charges are read from each photoelectric conversion element constituting each photoelectric conversion element row into a corresponding vertical charge transfer element. The vertical charge transfer elements transfer the charges read from one photoelectric conversion element row to the horizontal charge transfer element at the same phase.

The horizontal charge transfer element receives in parallel charges from the vertical charge transfer elements, and transfers the charges serially to an output unit.

The output unit converts charges received from the horizontal charge transfer element into image signals (voltage signals). These image signals are supplied to a video signal proceeding circuit formed, for example, in a semiconductor substrate different from that of the solid state image pickup device.

Recent image pickup apparatuses utilizing CCD type solid image pickup devices are provided with various functions such as an automatic exposure function (hereinafter abbreviated to "AE"), an automatic focus function (hereinafter abbreviated to "AF") and a digital zoom function, in order to make the apparatuses easy to use.

When the function such as AE, AF and digital zoom is used, image signals which correspond to charges read from some photoelectric conversion elements disposed in a part region, e.g. in a central area region of the photosensitive area are used for performing the function.

However, in this case, charges are read from all photoelectric conversion elements constituting one frame or field. All charges read into the vertical charge transfer elements are transferred down-to the output unit. Charges unnecessary for performing the function such as AE, AF and digital zoom are drained at the output unit.

As well known, the horizontal charge transfer element is driven at high speed. A consumption power of the element is therefore large. For example, a maximum percentage of the consumption power of the horizontal charge transfer element to the consumption power of the image pickup apparatus is about 30% when the function such as AE, AF and digital zoom is performed.

Furthermore, it takes a relatively long time to complete an operation of AE or AF for an electronic still camera having, for example, one million to several million pixels. A release time lag from a shutter release to an actual image pickup becomes relatively long in some cases. An actual image pickup may lose a decisive photographing chance.

If unnecessary charges can be drained at high speed without driving the horizontal charge transfer element, the consumption power of the apparatus during performing the function of AE, AF and digital zoom can be reduced. The release time lap can also be shortened.

JP-A-5-183820 discloses a CCD type solid state image pickup device capable of draining unnecessary charges from a horizontal charge transfer element (HCCD) at high speed. This solid state image pickup device has a signal-discharge drain disposed in stripe-shape along the horizontal charge transfer element, and a gate is formed between the signal-discharge drain and horizontal charge transfer element. The horizontal charge transfer element (charge transfer channel), gate and signal-discharge drain constitute the structure similar to a MOS transistor.

When a predetermined control voltage is applied to a gate electrode constituting the gate, charges in the horizontal charge transfer element are drained to the signal-discharge drain at a time. Unnecessary charges are drained from the horizontal charge transfer element to the signal-discharge drain in the unit of a photoelectric conversion element row.

In the solid state image pickup element described in the above-cited unexamined patent gazette, if the gate electrode and each horizontal transfer electrode constituting the horizontal charge transfer element are to be made of polysilicon, it becomes necessary to use first to third three polysilicon layers.

The manufacture yield of solid state image pickup devices is therefore likely to lower and the manufacture time is likely to prolong. Productivity is likely to lower.

SUMMARY OF THE INVENTION

It is an object of the present invention to provide a solid state image pickup device capable of draining unnecessary charges without transferring them to an output unit by a horizontal charge transfer element and facilitating to improve productivity.

It is another object of the present invention to provide a method of driving a solid state image pickup device capable of draining unnecessary charges without transferring them to an output unit by a horizontal charge transfer element and facilitating to improve productivity.

According to one aspect of the present invention, there is provided a solid state image pickup device comprising: a semiconductor substrate; a plurality of vertical charge transfer elements formed in one surface of said semiconductor substrate, each having (i) a vertical charge transfer channel having a first conductivity type and (ii) a plurality of vertical transfer electrodes formed on a first electrically insulating layer formed on the surface of said semiconductor substrate, the vertical transfer electrodes traversing the vertical charge transfer channels as viewed in plan; a plurality of photoelectric conversion elements formed in the surface of said semiconductor substrate in a matrix shape in rows and columns, each of said photoelectric conversion elements being electrically connectable to corresponding one of said vertical charge transfer elements; a horizontal charge transfer element formed in the surface of said substrate and being electrically connectable to each of said vertical charge transfer elements, said horizontal charge transfer element having (i) a horizontal charge transfer channel having the first conductivity type and (ii) a plurality of horizontal transfer electrodes formed on the first electrically insulating layer formed on the surface of said semiconductor substrate, each horizontal transfer electrode traversing the horizontal charge transfer channel as viewed in plan; a drain region formed in the surface of said semiconductor substrate along the horizontal charge transfer channel, said drain region having the first conductivity type; and a barrier region for charge formed between the horizontal charge transfer channel and said drain region, wherein the horizontal charge transfer channel, said drain region and said barrier region constitute a two-electrode element.

According to another aspect of the present invention, there is provided a method of driving a solid state image pickup device which device comprises (a) a semiconductor substrate, (b) a plurality of vertical charge transfer elements formed in one surface of said semiconductor substrate, (c) a plurality of photoelectric conversion elements formed in the surface of said semiconductor substrate in a matrix shape in rows and columns, each of said photoelectric conversion elements being electrically connectable to corresponding one of said vertical charge transfer elements, (d) a horizontal charge transfer element formed in the surface of said substrate and being electrically connectable to each of said vertical charge transfer elements, said horizontal charge transfer element having (i) a horizontal charge transfer channel having the first conductivity type and (ii) a plurality of horizontal transfer electrodes formed on the first electrically insulating layer formed on the surface of said semiconductor substrate, each horizontal transfer electrode traversing the horizontal charge transfer channel as viewed in plan, (e) a drain region formed in the surface of said semiconductor substrate along the horizontal charge transfer channel, said drain region having the first conductivity type; and (f) a barrier region for charge formed between the horizontal charge transfer channel and said drain region, wherein the horizontal charge transfer channel, the drain region and the barrier region constitute a two-electrode element, the method comprising the steps of: (A) transferring charges from each of the vertical charge transfer elements to the horizontal charge transfer element, and draining the charges from the horizontal charge transfer element to the drain region by applying a voltage relatively higher than voltages supplied to the horizontal transfer electrodes to the drain region; and (B) transferring charges from each of the vertical charge transfer elements to the horizontal charge transfer element, and transferring the charges in the horizontal charge transfer element to a predetermined direction.

The two-electrode element is structured by using the horizontal charge transfer channel, barrier region and drain region. Electrodes of the solid state image pickup device can be formed, for example, by first and second two polysilicon layers. A third polysilicon layer is not necessary.

Productivity is therefore easily improved more than the case that electrodes are formed by using first to third three polysilicon layers.

The two-electrode element may be formed by the horizontal charge transfer channel, barrier region and drain region, and in addition, the horizontal transfer electrodes and an electrode or a voltage supply line for applying a voltage to the drain region.

By applying a voltage to the drain region, the potential of the barrier region for charges can be lowered. By controlling the relative amplitude of the voltage applied to the drain region and the voltage applied to each horizontal transfer electrode, charges can be transferred from the horizontal charge transfer channel to the drain region of the two-electrode element. Charges stored in the horizontal charge transfer element can be discharged to the drain region.

The term "two-electrode element" in this specification means a semiconductor element of the type that conduction and insulation between two semiconductor regions spaced apart from each other and formed in a semiconductor substrate can be controlled without forming a gate electrode or switching element between the two regions.

BRIEF DESCRIPTION OF THE DRAWINGS

FIG. 1 is a schematic partial plan view showing a solid state image pickup device according to a first embodiment.

DESCRIPTION OF THE PREFERRED EMBODIMENTS

Figure 2:
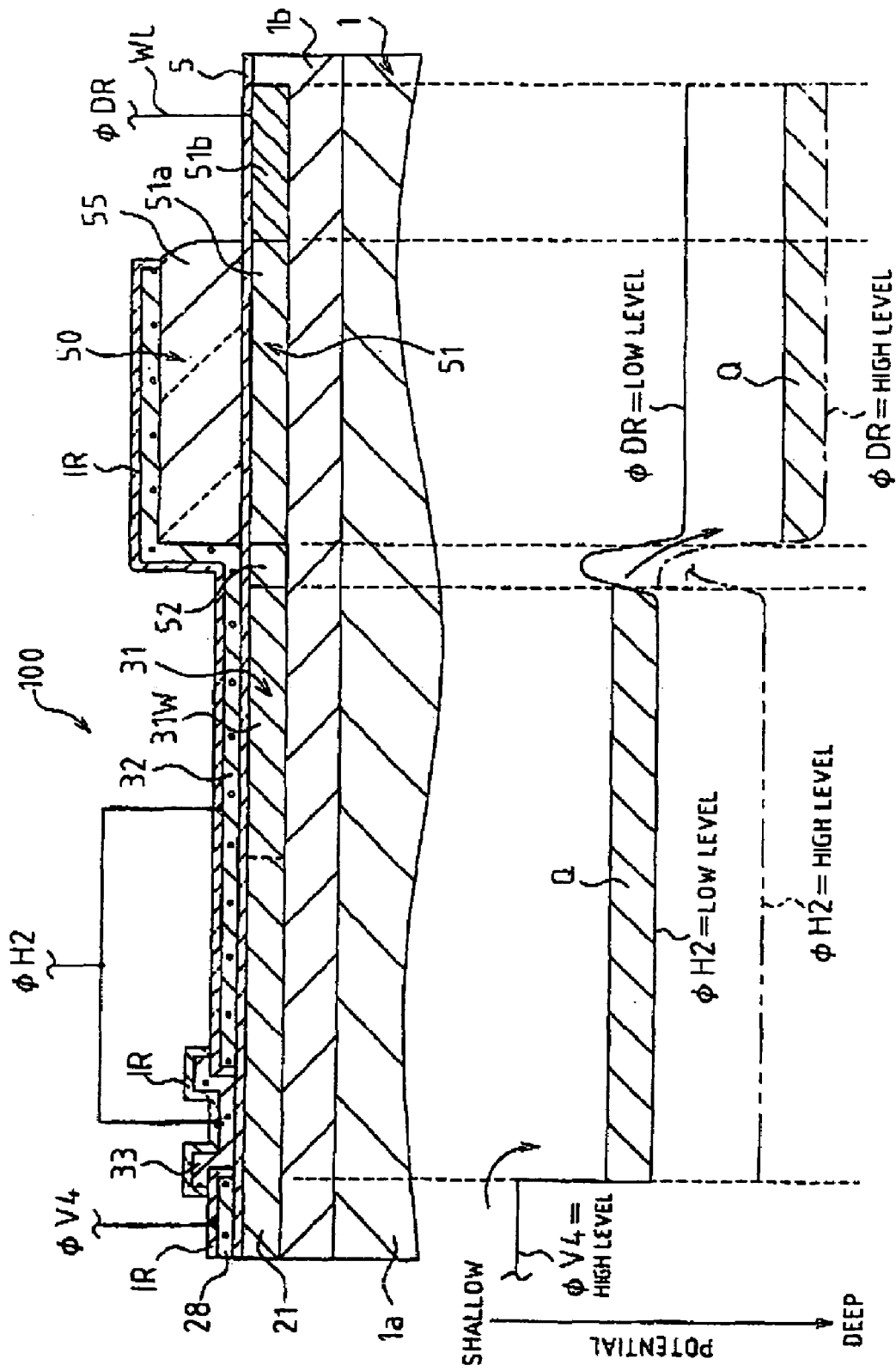
FIG. 2 is a schematic diagram showing the cross section of the solid state image pickup device taken along line II-II shown in FIG. 1 and a potential profile.

FIG. 1 is a schematic partial plan view showing a solid state image pickup device 100 according to a first embodiment. In FIG. 1, constituent members are omitted which are disposed above a semiconductor substrate at the upper level than a light shielding layer or a protective layer to be described later.

As shown in FIG. 1, the solid state image pickup device 100 has a semiconductor substrate 1. In one surface of the semiconductor substrate 1, a number of photoelectric conversion elements 15 are disposed in a matrix shape in rows and columns. Each photoelectric conversion element 15 is made of, e.g., a buried type pn photodiode. As light becomes incident upon the photoelectric conversion elements, charges are accumulated in the photoelectric conversion elements.

A vertical charge transfer element 20 is disposed along each photoelectric conversion element column. Each vertical charge transfer element 20 is made of a four-phase drive type CCD having one vertical charge transfer channel 21 formed in the semiconductor substrates a plurality of first and second vertical transfer electrodes 22 and 23 juxtaposed along the photoelectric conversion element column and first to third auxiliary transfer electrodes 26 to 28 juxtaposed downstream of the lowest vertical transfer electrode 23, respectively formed on the semiconductor substrate 1.

The first and second vertical transfer electrodes 22 and 23 and first to third auxiliary transfer electrodes 26 to 28 partially constitute each vertical charge transfer element 20. For example, each first vertical transfer electrode 22 and the first and third auxiliary transfer electrodes 26 and 28 are made of a first polysilicon layer, and each second vertical transfer electrode and the second auxiliary transfer electrode 27 are made of a second polysilicon layer.

These transfer electrodes 22 and 23, 26 to 28 are formed on a first electrically insulating layer (not shown) formed on the semiconductor substrate 1. Each of the transfer electrodes 22 and 23, 26 to 28 is insulated by an electrically insulating layer (thermal oxidation layer) (IR in FIG. 2) covering the electrode.

The transfer electrodes 22 and 23, 26 to 28 are classified into four groups respectively supplied with different vertical drive signals $\phi V1$, $\phi V2$, $\phi V3$ and $\phi V4$. Each group is constituted of every fourth transfer electrodes.

By properly selecting the waveforms of the four-phase vertical drive signals $\phi V1$ to $\phi V4$, it is possible to read charges from the photoelectric conversion elements 15 to associated vertical charge transfer element 20 and to transfer the charges read into the vertical charge transfer elements 20 to a horizontal charge transfer element 30.

In order to control the charge read from the photoelectric conversion element 15 to the associated vertical charge transfer element 20, a read gate 25 is disposed for each photoelectric conversion element 15 adjoining to the associated element 15. The read gate 25 is constituted of a read gate channel region (not shown) formed in the semiconductor substrate 1 and a partial area of the second vertical transfer electrode 23 disposed above the read gate channel region. In FIG. 1, in order to easily locate the read gates 25, each read gate 25 is shown hatched.

Each photoelectric conversion element 15 constituting the photoelectric conversion element column can be electrically connected to the corresponding vertical charge transfer element 20 with involvement of the read gate 25. As a read pulse is applied to the second vertical transfer electrode 23, charges can be read from the photoelectric conversion elements 15 into the corresponding vertical charge transfer elements 20 with involvement of the read gates 25 structured with partial areas of the second vertical transfer electrode 23.

Reading charges from the photoelectric conversion elements 15 to the vertical charge transfer elements 20 are performed in the unit of a photoelectric conversion element row. Charges read into the vertical charge transfer elements 20 in the unit of a photoelectric conversion element row are transferred to the horizontal charge transfer element 30 at the same phase.

The horizontal charge transfer element 30 is constituted of a two-phase drive type CCD having one horizontal charge transfer channel 31 formed in the semiconductor substrate 1, first and second horizontal transfer electrodes 32 and 33 of a comb shape, and a plurality of third and fourth horizontal transfer electrodes 34 and 35 of a harrow shape, respectively formed on the semiconductor substrate 1. For example, the first horizontal transfer electrode 32 and third horizontal transfer electrodes 34 are made of the first polysilicon layer, and the second horizontal transfer electrode 33 and fourth horizontal transfer electrodes 35 are made of the second polysilicon layer.

In a horizontal charge transfer channel 31, a potential barrier region 31B and a potential well region 31W are alternatively disposed in this order from the upstream side to downstream side. In FIG. 1, in order to make it easy to understand the drawing, each potential barrier region 31B is shown hatched.

Each area configurationally corresponding to the backbone of a comb of the first and second horizontal transfer electrodes 32 and 33 traverses each vertical charge transfer channel 21 as viewed in plan. Each area configurationally corresponding to the tooth of the comb of the first horizontal transfer electrode 32 covers associated potential well region 31W. Each area configurationally corresponding to the tooth of the comb of the second horizontal transfer electrode 33 covers associated potential barrier region 31B.

Each third horizontal transfer electrode 34 covers one potential well region 31W and the third potential well region 31W as counted from the first-mentioned potential well region 31W toward the upstream side. Each fourth horizontal transfer electrode 35 covers one potential barrier region 31B and the third potential barrier region 31B as counted from the first-mentioned potential barrier region 31B toward the upstream side.

Above the horizontal charge transfer channel 31, the third, fourth, first and second horizontal transfer electrodes 34, 35, 32 and 33 are disposed in this order from the downstream side to the upstream side.

The first and second horizontal transfer electrodes 32 and 33 are supplied with a horizontal drive signal $\phi H2$. The third and fourth horizontal transfer electrodes 34 and 35 are supplied with a horizontal drive signal $\phi H1$. As the horizontal drive signal $\phi H2$ is set to a low level (e.g., 0 V) or a high level (e.g., 3.5 V) while the vertical drive signal $\phi V4$ takes a high level (e.g., 0 V), charges can be transferred from the vertical charge transfer elements 20 to the horizontal charge transfer element 30. The charges are distributed into the potential well regions 31W under the first horizontal transfer electrode 32.

By properly selecting the waveforms of the two-phase horizontal drive signals φH1 and φH2, it is possible to transfer charges in the horizontal charge transfer element 30 to the output unit 40.

The output unit 40 converts charges transferred from the horizontal charge transfer element 30 into voltage signals by using, for example, a floating capacitor (not shown), and amplifies each voltage signal by using a source follower circuit (not shown) or the like. The charge in the floating capacitor after detection (conversion) is drained to a power source (not shown) via a reset transistor (not shown). The output unit 40 can be structured, for example, like an output unit described in the paragraphs [0084] to [0091] of the specification of Japanese patent application number Hei11-287326 with reference to FIG. 4(*b*).

A drain region 51 constituted of a first drain region 51*a* and a second drain region 51*b* adjacent to the first drain region 51*a* is formed in the surface of the semiconductor substrate 1 along the horizontal charge transfer channel 31. The second drain region 51*b* has a deeper potential for charges than that of the first drain region 51*a*.

The second drain region 51*b* of the drain region 51 is supplied with a control signal φDR through a wiring line WL. If necessary, an electrode is formed on the first electrical insulating layer formed on the second drain region 51*b*.

A barrier region 52 for charge is formed between the horizontal charge transfer channel 31 and first drain region 51*a*.

The horizontal charge transfer channel 31, barrier region 52 and drain region 51 constitute a two-electrode element. By controlling the voltage value of the control signal φDR to be supplied to the drain region 51, the potential of the barrier region 52 for charges can be controlled. By controlling relative amplitude of the voltage value of the control signal φDR and the voltage values of the horizontal drive signals φH1 and φH2, charges can be transferred from the horizontal charge transfer channel 31 to the drain region 51. Charges in the horizontal charge transfer element 30 can be drained to the drain region 51. In the following, this two-electrode element is called simply a "discharge drain 50" where appropriate.

The principle of draining charges in the horizontal charge transfer element 30 to the drain region 51 will be detailed with reference to FIG. 2. In the following, it is assumed that the solid state image pickup device 100 is formed by using an n-type semiconductor substrate with a p-type impurity doped region formed in or on a surface of the n-type semiconductor substrate.

FIG. 2 is a schematic diagram showing the cross section of the solid state image pickup device 100 taken along line II-II shown in FIG. 1 and a potential profile.

As described above and as shown in FIG. 2, the semiconductor substrate 1 is made of an n-type semiconductor substrate 1*a* having an n-type impurity concentration of, e.g., about $1\times10^{14}$ to $10\times10^{14}/cm^3$ and a p-type impurity doped region 1*b* formed on or in the surface of the n-type semiconductor substrate 1*a*. The p-type impurity concentration in the p-type impurity doped region 1*b* is, e.g., about $7\times10^{15}$ to $7\times10^{16}/cm^3$.

The vertical charge transfer channel 21, the potential well region 31W of the horizontal charge transfer channel 31, and the first drain region 51*a* are made of an n-type impurity doped region formed in the p-type impurity doped region 1*b*. The n-type impurity concentrations in the channel 21, potential well region 31W, and first drain region 51*a* are, e.g., about $6\times10^{16}$ to $6\times10^{17}/cm^3$. In the example shown in FIG. 2, the n-type impurity concentrations of the channel 21, potential well region 31W, and first drain region 51*a* are the same.

The second drain region 51*b* is made of an n$^+$-type impurity doped region formed in the p-type impurity doped region 1*b*. The n-type impurity concentration of the second drain region 51*b* is, e.g., about $1\times10^{18}/cm^3$.

The barrier region 52 is made of an n$^-$-type impurity doped region formed in the p-type impurity doped region 1*b*. For example, the barrier region 52 is formed by forming an n-type impurity doped region having an n-type impurity concentration of about $6\times10^{16}$ to $6\times10^{17}/cm^3$ in the p-type impurity doped region 1*b* and thereafter doping p-type impurities into the n-type impurity doped region to about $1\times10^{16}$ to $10\times10^{16}/cm^3$.

The width (width along the photoelectric conversion element column direction) of the horizontal charge transfer channel 31 is, e.g., about 40 to 80 μm. The width (width along the photoelectric conversion element column direction) of the barrier region 52 is, e.g., about 0.2 to 1.2 μm. The widths (widths along the photoelectric conversion element column direction) of the first and second drain regions 51*a* and 51*b* are, e.g., about 75 μm and about 5 μm, respectively.

The first electrically insulating layer 5 is formed on the surface of the semiconductor substrate 1. The material of this layer 5 is, for example, electrically insulating oxide such as silicon oxide, or electrically insulating nitride such as silicon nitride. For example, the first electrically insulating layer 5 has a single-layer structure made of an electrically insulating oxide layer, a two-layer structure made of an electrically insulating oxide layer and an electrically insulating nitride layer formed thereon, or a three-layer structure made of an electrically insulating oxide layer, an electrically insulating nitride layer formed thereon, and an electrically insulating oxide layer formed thereon.

The first and second vertical transfer electrodes 22 and 23, first to third auxiliary transfer electrodes 26 to. 28, and first to fourth horizontal transfer electrodes 32 to 35 are formed on the first electrically insulating layer 5. The first to fourth horizontal transfer electrodes 32 to 35 cover the horizontal charge transfer channel 31 and barrier region 52. In FIG. 2, only portions of the third auxiliary electrode 28 and second horizontal transfer electrode 33, and the first horizontal transfer electrode 32 appear, and the other electrodes do not appear.

A second electrically insulating layer 55 thicker than the first electrically insulating layer 5 is formed above the first drain region 51*a*. For example, the second electrically insulating layer 55 is made of silicon oxide, PSG (phosphosilicate glass), BPSG (borophosphosilicate glass), SOG (spin on glass) or the like. The thickness of the second electrically insulating layer 55 is, e.g., about 6000 angstroms (600 nm).

For example, the second electrically insulating layer 55 is formed by various methods such as (i) the first electrically insulating layer 5 is formed also on the first drain region 51*a* and thereafter the semiconductor substrate 1 is subjected to thermal oxidation, (ii) the first electrically insulating layer 5 is formed also on the first drain region 51*a* and thereafter another electrically insulating layer is deposited thereon by CVD (chemical vapor deposition) or the like, and (iii) the first electrically insulating layer 5 is not formed on the first drain region 51a and another electrically insulating layer is deposited directly on the first drain region 51a by CVD or the like.

The first to fourth horizontal transfer electrodes 32 to 35 of the solid state image pickup device 100 cover the horizontal charge transfer channel 31, barrier region 52 and second electrically insulating layer 55 as viewed in plan.

Therefore, the potential of the first drain region 51a for charges (in this case, electrons) is deeper than that of the horizontal charge transfer channel 31. However, while the control signal φDR of a low level (e.g., about 9 to 11 V) is applied to the drain region 51, the potential of the barrier region 52 cannot be made deeper than the potential of the horizontal charge transfer channel 31.

Namely, while the control signal φDR of a low level is applied to the drain region 51, the potential of the barrier region 52 is shallower than the potential of the horizontal charge transfer channel 31, so that a conductive path is not formed between the horizontal charge transfer channel 31 and drain region 51.

As the potential (voltage) of the control signal φDR is raised, the potential of the second drain region 51b becomes deeper. The potential difference between the first drain region 51a and the second drain region 51b forms a depletion state in the first drain region 51a. A potential gradient is formed at an interface with the barrier region 52 in the first drain region 51a, and extend to the inside of the barrier region 52.

As the control signal φDR of a high level (e.g., about 33 to 35 V) is applied, the potential of the second drain region 51b becomes much deeper. The potential of the barrier region 52 on the side of the potential well region 31W becomes similar to or deeper than the potential of the potential well region 31W. The barrier therefore disappears and a conductive path is formed between the potential well region 31W and drain region 51.

As described earlier, if the horizontal drive signal φH2 is set to a low or high level while the vertical drive signal φV4 takes the high level, charges can be transferred from the vertical charge transfer elements 20 to the horizontal charge transfer element 30.

Figure 3:
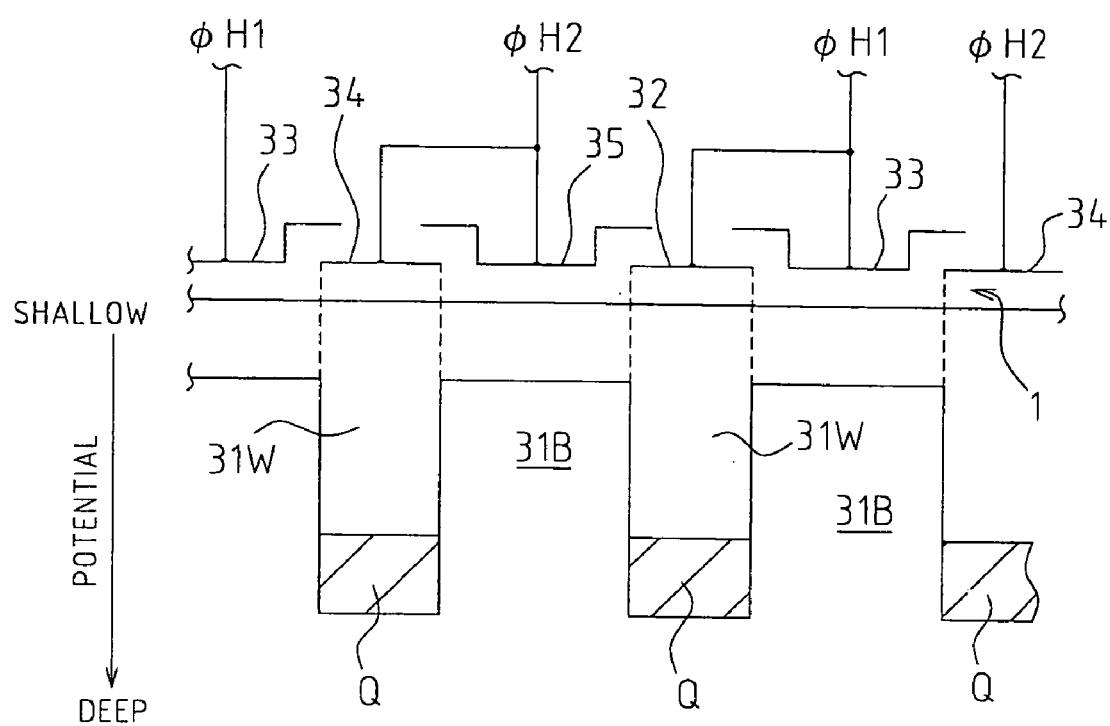
FIG. 3 is a schematic diagram showing the distribution state of charges in a horizontal charge transfer element when charges are transferred from each vertical charge transfer element to the horizontal charge transfer element of the solid state image pickup device shown in FIG. 1.

FIG. 3 is a schematic diagram showing the distribution state of charges in the horizontal charge transfer element 30 when charges are transferred from each vertical charge transfer element 20 to the horizontal charge transfer element 30. As shown in FIG. 3 and as described earlier, the charges Q are distributed into the potential well regions 31W of the horizontal charge transfer element 30.

When the charges Q are drained from the horizontal charge transfer element 30 to the drain region 51, the vertical drive signal φV4 is set to a low level (e.g., −8 V) to inhibit the charges Q from being reversely transferred from the horizontal charge transfer element 30 to the vertical charge transfer elements 20.

Next, the control signal φDR is set to the high level and the horizontal drive signal φH2 is set to the low level. As shown in FIG. 2, a conductive path is formed between the potential well regions 31W and drain region 51, so that the charges Q distributed in the potential well regions 31W are drained to the drain region 51. The charges Q drained to the drain region 51 are absorbed in the power source (not shown). In this case, it is preferable to set the horizontal drive signal φH1 to the low level.

During the period that charges in the horizontal charge transfer element 30 are not necessary to be drained to the drain region 51, the control signal φDR is set to the low level.

By controlling relative amplitude of the voltage value of the control signal φDR supplied to the drain region 51 and the voltage values of the horizontal drive signals φH1 and φH2 supplied for the horizontal charge transfer element 30, it becomes possible to control whether charges in the horizontal charge transfer element 30 are to be drained to the drain region 51. A conductive path can also be formed between the potential well regions 31W and drain region 51 while the horizontal drive signal φHH2 takes the high level.

Each potential barrier region 31B of the horizontal charge transfer element 30 may be made of, for example, an n-type impurity doped region and a $p^-$-type impurity doped region formed thereon. Each potential well region 31W may be made of an $n^+$-type region and each potential barrier region 31B is made of an n-type region.

As described earlier, when the function such as AE, AF and digital zoom of an image pickup apparatus using a solid state image pickup device is performed, image signals are used which correspond to charges read from some photoelectric conversion elements in the photosensitive area of the solid state image pickup device, e.g., predetermined photoelectric conversion elements disposed in a central area of the photosensitive area. The photosensitive area is an area in which photoelectric conversion elements and corresponding vertical charge transfer elements are disposed.

Figure 4:
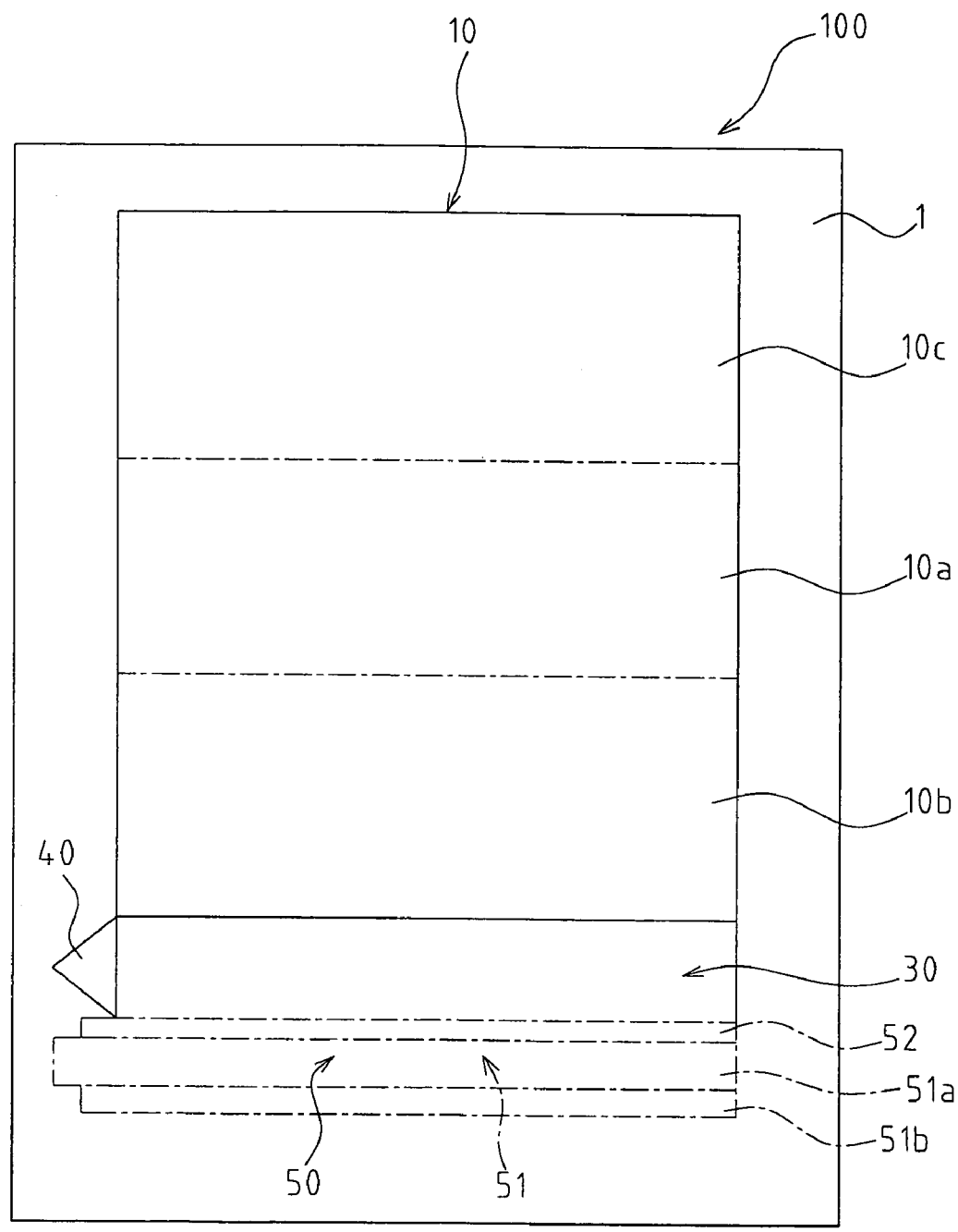
FIG. 4 is a schematic diagram showing distribution areas of necessary charges and unnecessary charges in the solid state image pickup device shown in FIG. 1.

FIG. 4 is a schematic diagram showing distribution areas in the photosensitive area 10 of charges (hereinafter called "necessary charges") used for performing the function such as AE, AF and digital zoom of the solid state image pickup device 100 and charges (hereinafter called "unnecessary charges") not used for performing the function. In FIG. 4, like elements to those shown in FIG. 1 are represented by using identical reference symbols, and the description thereof is omitted.

The necessary charges are read from photoelectric conversion elements formed in the central area 10a of the photosensitive area 10 shown in FIG. 4. The unnecessary charges are read from photoelectric conversion elements formed in an area 10b downstream of the central area 10a and in an area 10c upstream of the central area 10a.

When the function such as AE, AF and digital zoom is performed, the solid state image pickup device 100 is driven, for example, by interlace scanning. One frame is divided into a first field constituted of, e.g., even rows photoelectric conversion elements 15 and a second field constituted of odd rows photoelectric conversion elements 15. Charges are read in the unit of a field from the photoelectric conversion elements 15 into the associated vertical charge transfer elements 20. Charges are then transferred from the vertical charge transfer elements 20 to the horizontal charge transfer element 30 which drains the unnecessary charges to the drain region 51 and transfers the necessary charges to the output unit 40.

Figure 5:
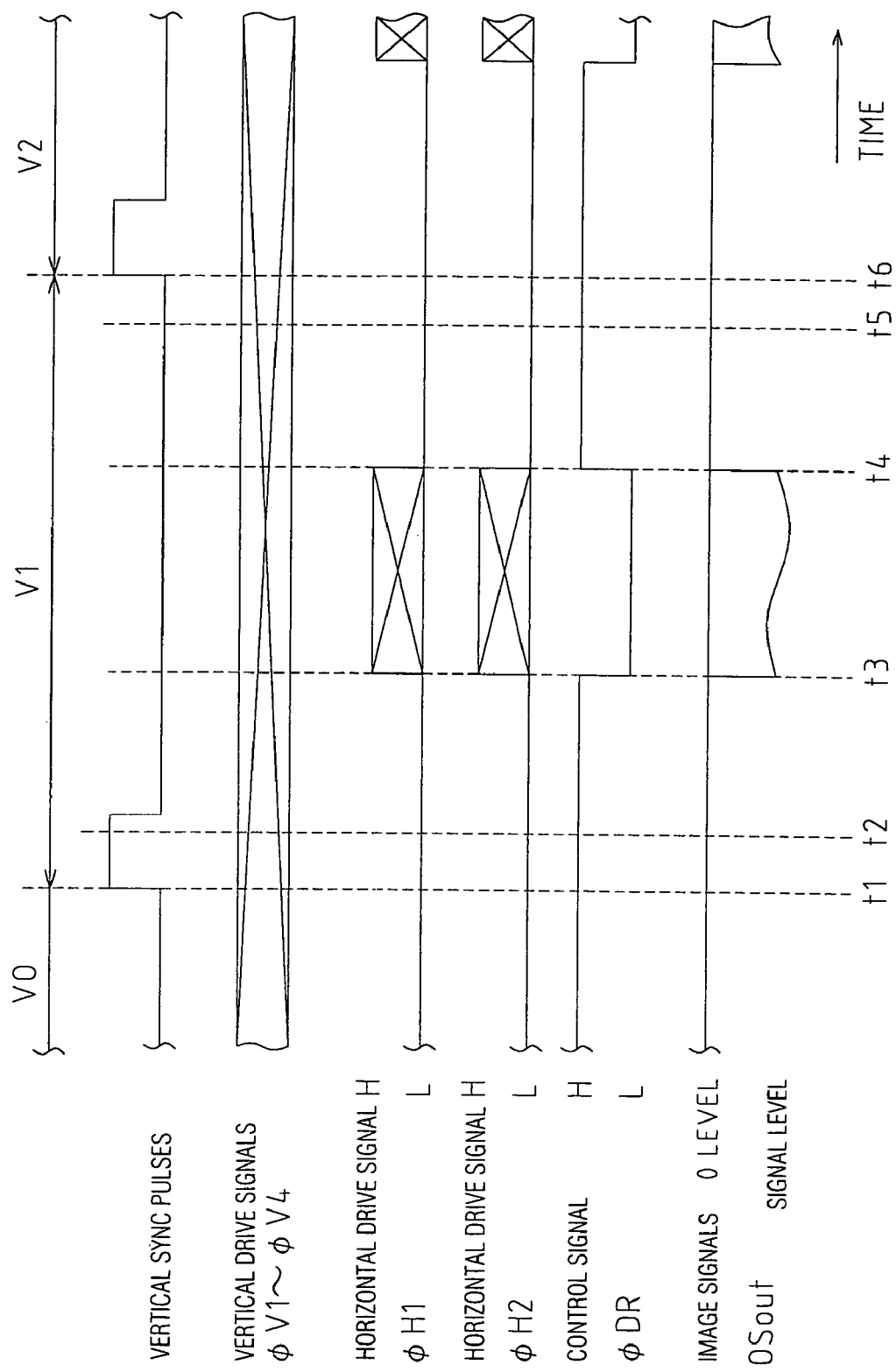
FIG. 5 is a diagram showing examples of the waveforms of vertical drive signals φV1 to φV4, horizontal drive signals φH1 and φH2, a control signal φDR, and image signals $OS_{out}$ output from an output unit, respectively used for using the function such as AE, AF and digital zoom of an electronic still camera having the solid state image pickup device shown in FIG. 1.

FIG. 5 is a diagram showing examples of the waveforms of the vertical drive signals φV1 to φV4, horizontal drive signals φH1 and φH2, control signal φDR, and image signals $OS_{out}$ output from the output unit 40, respectively used for performing the function such as AE, AF and digital zoom of an electronic still camera having the solid state image pickup device 100.

Figure 6:
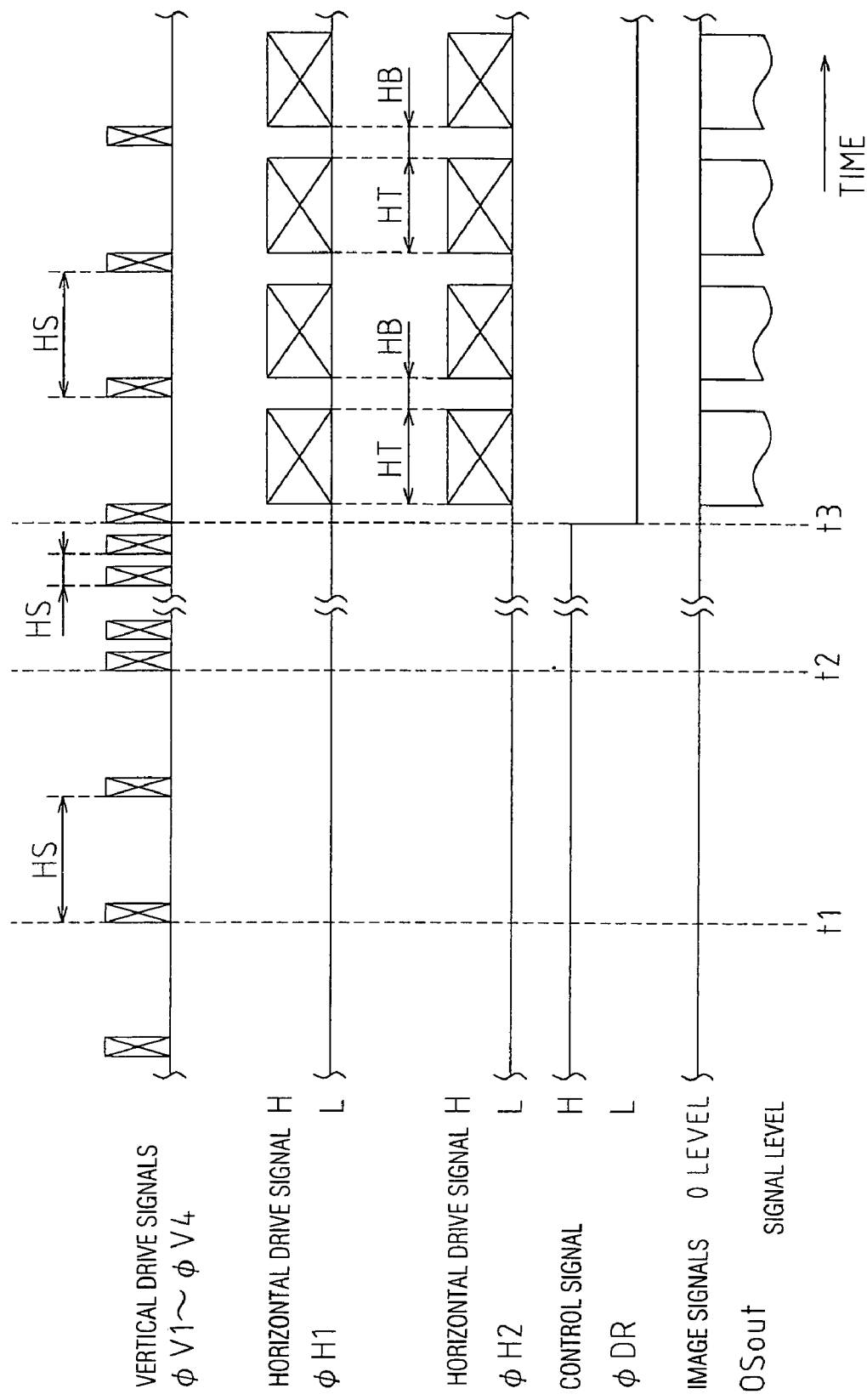
FIG. 6 is a diagram showing the waveforms of the signals shown in FIG. 5 partially enlarged.

FIG. 6 is a diagram showing the waveforms of the signals shown in FIG. 5 partially enlarged.

As shown in FIG. 5, a vertical sync pulse rises at a predetermined period. One vertical period V corresponds to a period from when one vertical sync pulse rises to when the next vertical sync pulse rises. In FIG. 5, three vertical periods V0, V1 and V2 are shown.

During one vertical period V, charges are read from the photoelectric conversion elements 15 in the first field into the associated vertical charge transfer elements 20, and then transferred via the horizontal charge transfer element 30 to the drain region 51 or output unit 40. In the following description, it is assumed that the first field is constituted of the even rows photoelectric conversion elements.

For example, as a shutter button is half-depressed, the image signal $OS_{out}$ corresponding to necessary charges for the AE or AF operation is output and the unnecessary charges are drained to the drain region 51, during a period from a start time t1 to an end time t6 of the vertical period V1 first set up after the half-depression of the shutter button.

During this period, a read pulse is superpositioned upon the vertical drive signal $\phi V3$, for example, at the time t1. Each of the vertical drive signals $\phi V1$ to $\phi V4$ changes its level at the start time of each horizontal scan period HS to perform a line-shift, and thereafter maintains its high or low level until the horizontal scan period HS ends. As shown in FIG. 6, a plurality of horizontal scan periods HS are repeated during the period from time t1 to time t6.

During the period from time t1 to time t3 and the period from time t4 to time t6, the horizontal drive signals $\phi H1$ and $\phi H2$ maintain a low level L and the control signal $\phi DR$ maintains a high level H. Therefore, charges transferred to the horizontal charge transfer element 30 during the period from time t1 to time t3 and the period from time t4 to time t6, are drained to the drain region 51.

For example, during the period from time t1 to time t2, charges which might cause smear are transferred to the horizontal charge transfer element 30 and drained to the drain region 51. If the solid state image pickup device 100 has an optical black area and a dummy area downstream of the area 10b shown in FIG. 4, charges accumulated in these areas are also transferred to the horizontal charge transfer element 30 and drained to the drain region 51 during the period from time t1 to time t2. If the solid state image pickup device 100 has an optical black area and a dummy area upstream of the area 10c shown in FIG. 4, charges accumulated in these areas are also transferred to the horizontal charge transfer element 30 and drained to the drain region 51 during the period from time t5 to time t6.

During the period from time t2 to time t3, unnecessary charges read from the photoelectric conversion elements formed in the area 10b shown in FIG. 4 are sequentially transferred in the unit of a photoelectric conversion element row to the horizontal charge transfer element 30 and drained to the drain region 51.

During the period from time t4 to time t5, unnecessary charges read from the photoelectric conversion elements formed in the area 10c shown in FIG. 4 are sequentially transferred in the unit of a photoelectric conversion element row to the horizontal charge transfer element 30 and drained to the drain region 51.

During the period from time t3 to time t4, necessary charges read from the photoelectric conversion elements formed in the area 10a shown in FIG. 4 are transferred to the horizontal charge transfer element 30 and to the output unit 40. During this period, the control signal $\phi DR$ maintains the low level L to inhibit charges from being drained from the horizontal charge transfer element 30 to the drain region 51.

As shown in FIG. 6, during the period from time t3 to time t4, a predetermined number of horizontal transfer periods HT and the predetermined number of horizontal blanking periods HB are alternately set. In each horizontal transfer period HT, the horizontal drive signals $\phi H1$ and $\phi H2$ alternately change the level from the high level H to low level L or vice versa while the opposite phases are maintained. The necessary charges read from the photoelectric conversion elements formed in the area 10a shown in FIG. 4 are sequentially transferred to the horizontal charge transfer element 30 and to the output unit 40, in the unit of one photoelectric conversion element row per one horizontal transfer period HT. The output unit 40 sequentially generates the image signals $OS_{out}$ from these charges.

The electronic still camera having the solid state image pickup device 100 generates data necessary for the AE or AF operation by using the image signals $OS_{out}$ generated by the output unit 40 during the period from time t3 to time t4, and performs the AE or AF operation in accordance with the generated data.

As described above, when the function such as AE, AF and digital zoom of the image pickup apparatus using a solid state image pickup device 100 is performed, the unnecessary charges can be drained via the horizontal charge transfer element 30 to the drain region 51 without transferring the unnecessary charges via the horizontal charge transfer element 30 to the output unit 40.

The drive frequency for the vertical charge transfer elements 20 can be raised higher during the period while unnecessary charges are drained to the drain region 51 (e.g., during the period from time t2 to time t3 and during the period from time t4 to time t5 shown in FIG. 5) than during the period while necessary charges are transferred (e.g., during the period from time t3 to time t4 shown in FIG. 5).

Accordingly, a time taken to acquire data necessary for performing the function such as AE, AF and digital zoom is shortened more than the case that unnecessary charges are transferred to the output unit and drained at the output unit. It is also possible to reduce the consumption power with ease.

For example, if the solid state image pickup device 100 has photoelectric conversion elements in the order of about three million pixels and three thousand photoelectric conversion element rows, it is possible to shorten the time taken to acquire the data necessary for the AE or AF operation by about 30%. The time taken to acquire data necessary for the digital zoom operation can also be shortened. The case that an actual image pickup loses a decisive photographing chance becomes hard to occur.

The electrodes of the solid state image pickup device 100 can be formed by using the first and second two polysilicon layers without using a third polysilicon layer. The productivity can be easily improved more than the case that the electrodes are formed by using first to third three polysilicon layers.

Next, a solid state image pickup device according to a second embodiment will be described with reference to FIGS. 7 and 8A.

Figure 7:
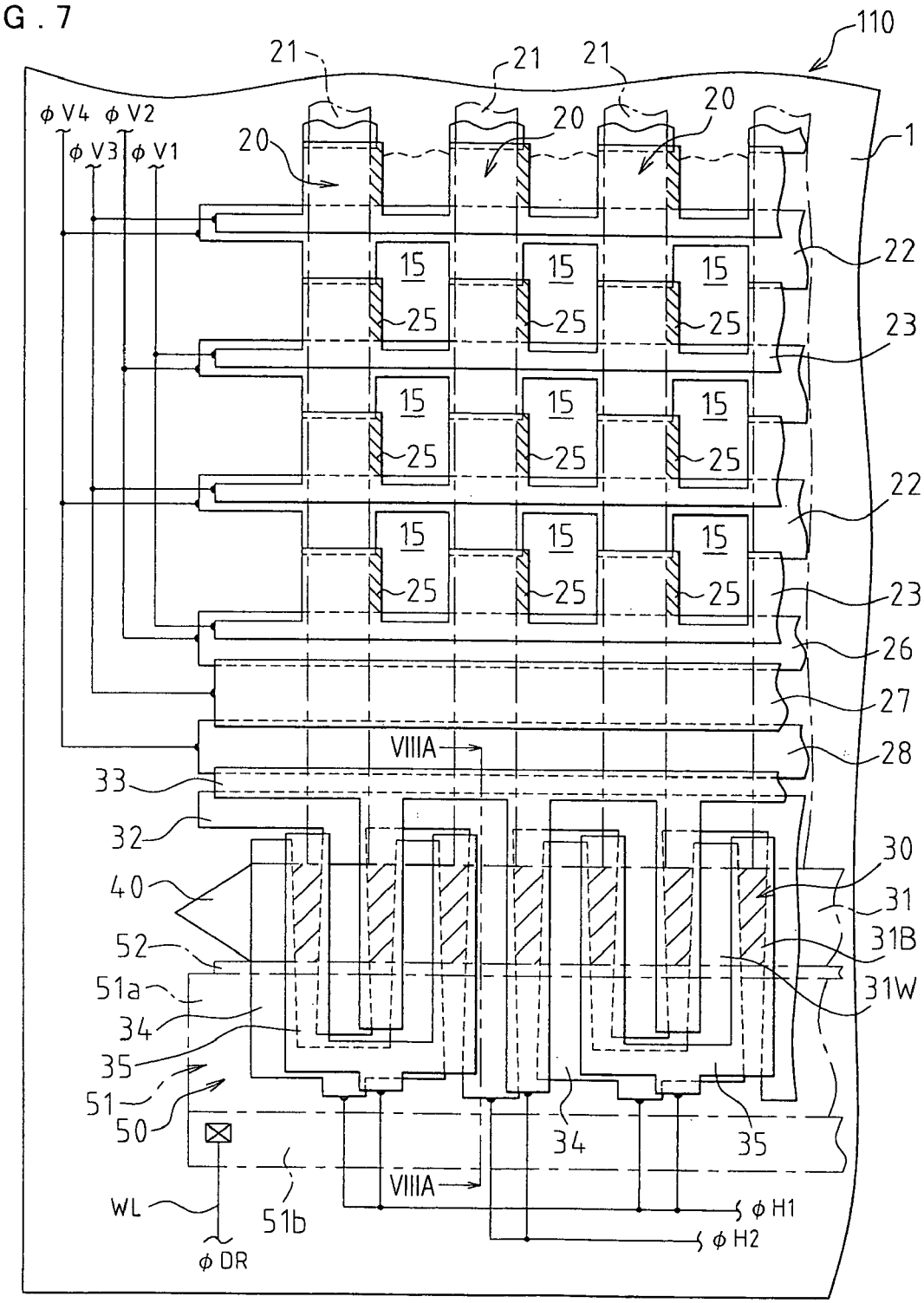
FIG. 7 is a schematic partial plan view showing a solid state image pickup device according to a second embodiment.

FIG. 7 is a schematic partial plan view showing a solid state image pickup device 110 according to the second embodiment. In FIG. 7, constituent members are omitted which are disposed above a semiconductor substrate at the upper level than a light shielding layer or a protective layer to be described later.

Figure 8A:
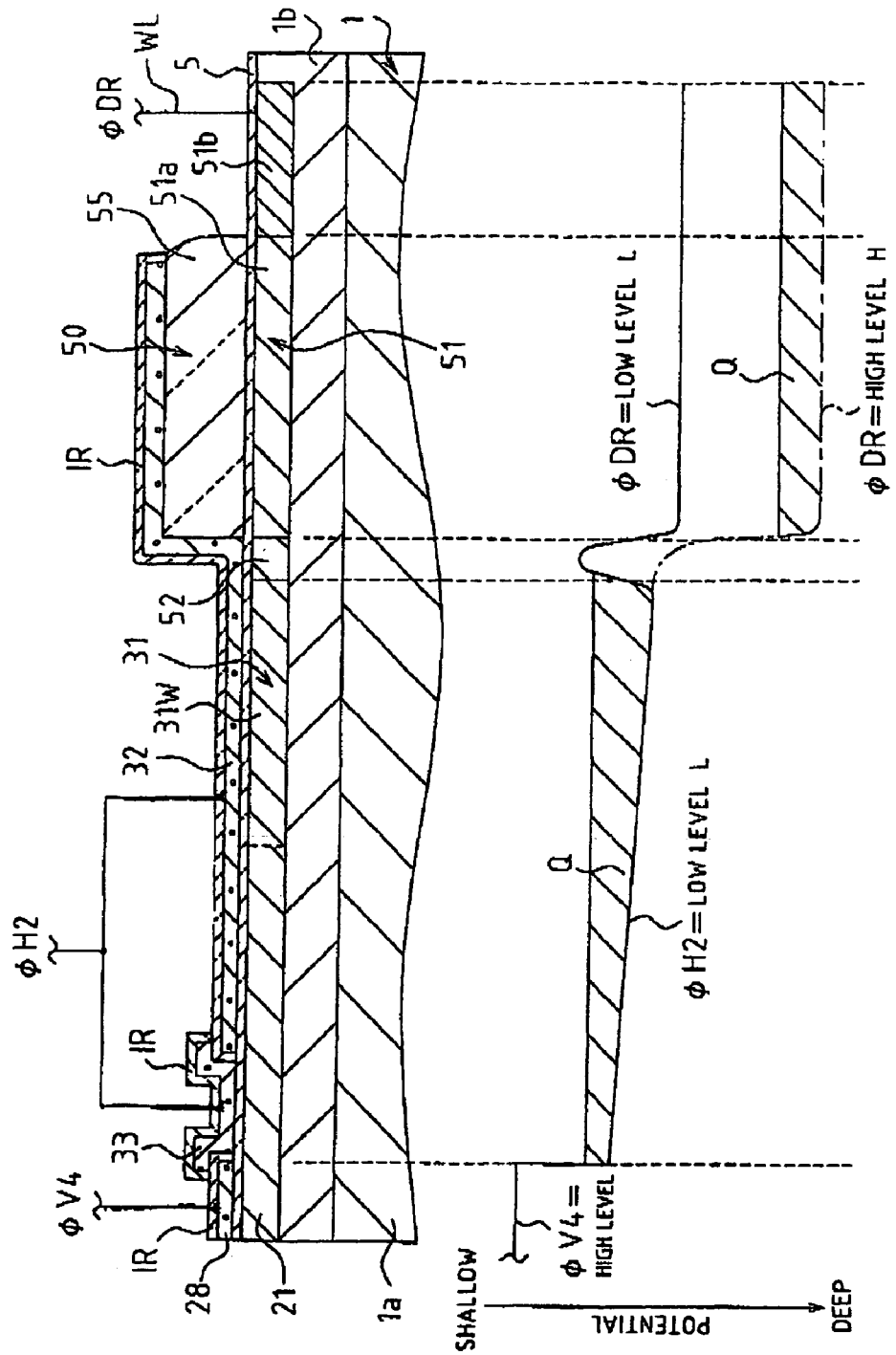
FIG. 8A is a schematic diagram showing the cross section of the solid state image pickup device taken along line VIII-VIII shown in FIG. 7 and a potential profile.

FIG. 8A is a schematic diagram showing the cross section of the solid state image pickup device 110 taken along line VIII-VIII shown in FIG. 7 and a potential profile.

In FIGS. 7 and 8A, constituent elements having functions common to those of the constituent elements shown in FIG. 1 or 2 are all shown. The constituent elements having the functions common to those of the constituent elements shown in FIG. 1 or 2 are therefore represented by identical reference symbols and the description thereof is omitted.

In the solid state image pickup device 110 shown in FIGS. 7 and 8A, the width of each potential well region 31W of the horizontal charge transfer channel 31 as viewed in plan is gradually broadened toward the barrier region 52. In correspondence with this, the width of each of the first and third horizontal transfer electrodes 32 and 34 above each potential well region 31W as viewed in plan is gradually broadened toward the barrier region 52.

Conversely to the potential well regions 31W, the width of each potential barrier region 31B as viewed in plan is gradually broadened away from the barrier region 52.

As shown in FIG. 8A, since the horizontal charge transfer element 30 is structured as described above, the potential of the potential well region 31W for charge gradually deepens toward the barrier region 52. With this inherently formed potential-gradient, charges Q in the potential well regions 31W can be reliably drained to the drain region 51.

Similar effects can be expected if the width of the potential well region 31W as viewed in plan is stepwise broadened toward the barrier region 52.

Figure 8B:
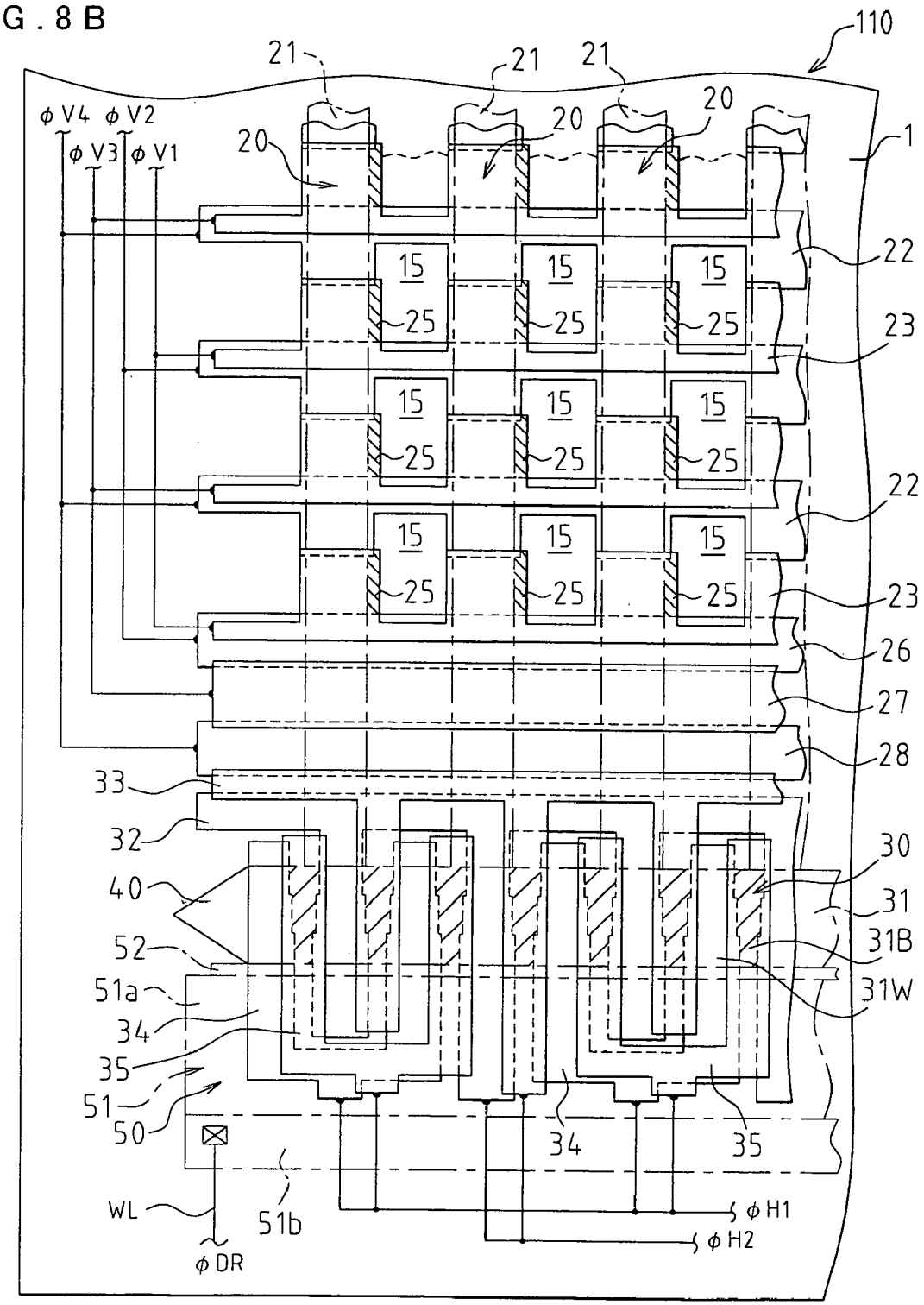
FIG. 8B is a schematic partial plan view showing a solid state image pickup device according to a modification of the solid state image pickup device of the second embodiment.

FIG. 8B is a schematic partial plan view showing a solid state image pickup device 115 according to a modification of the solid state image pickup device 110. In FIG. 8B, constituent elements having functions common to those of the constituent elements shown in FIG. 7 are all shown. The constituent elements having the functions common to those of the constituent elements shown in FIG. 7 are therefore represented by identical reference symbols and the description thereof is omitted.

As shown in FIG. 8B, the width of each potential well region 31W of the solid state image pickup device 115 is stepwise broadened toward the barrier region 52, as viewed in plan. Next, a solid image pickup device according to a third embodiment will be described with reference to FIG. 9.

Figure 9:
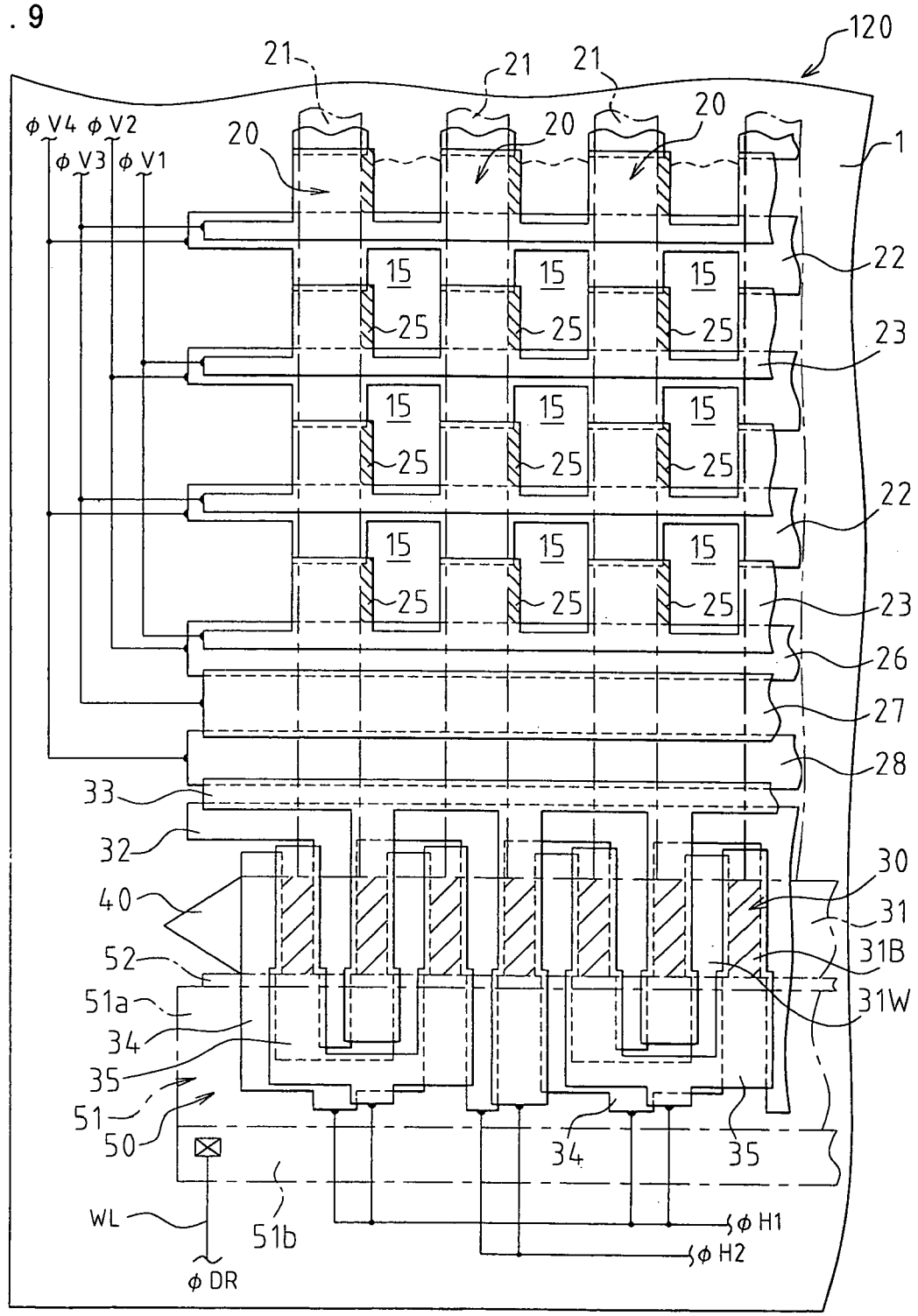
FIG. 9 is a schematic partial plan view showing a solid state image pickup device according to a third embodiment.

FIG. 9 is a schematic partial plan view showing the solid state image pickup device 120 according to the third embodiment. In FIG. 9, constituent members are omitted which are disposed above a semiconductor substrate at the upper level than a light shielding layer or a protective layer to be described later.

In FIG. 9, constituent elements having functions common to those of the constituent elements shown in FIG. 1 are all shown. The constituent elements having the functions common to those of the constituent elements shown in FIG. 1 are therefore represented by identical reference symbols and the description thereof is omitted.

In the solid state image pickup device 120 shown in FIG. 9, the width of each of the first and third horizontal transfer electrodes 32 and 34 as viewed in plan is made narrower above the barrier region 52 than above the potential well region 31W. It is therefore possible to make shallower the potential of the barrier region 52 when the horizontal drive signals φH1 and φH2 applied than the potential of the potential well region 31W, even if the n-type impurity concentration in the barrier region 52 is set to the same degree as the concentration in the potential well region 31W. The number of manufacture steps can therefore be reduced more than the case that the barrier region 52 is made of the n⁻-type impurity doped region.

If each potential barrier region 31B is made of an n-type impurity doped region and a p⁻-type impurity doped region formed thereon, the width (width along the photoelectric conversion row direction) of each potential well region 31W as viewed in plan may be narrowed partially, and the width (width along the photoelectric conversion row direction) of each potential barrier region 31B is broadened correspondingly.

In this case, the influence of the narrow channel effects caused by the p⁻-type impurity doped region of the potential barrier region 31 B is enhanced in the area where the width of the potential well region 31W is narrowed.

It is therefore possible to set the n-type impurity concentration in the barrier region 52 to the same degree as the n-type impurity concentration in the potential well region 31W. It is preferable to narrow the width of the potential well region 31W in an area nearer to the barrier region 52.

Next, a solid image pickup device according to a fourth embodiment will be described with reference to FIG. 10.

Figure 10:
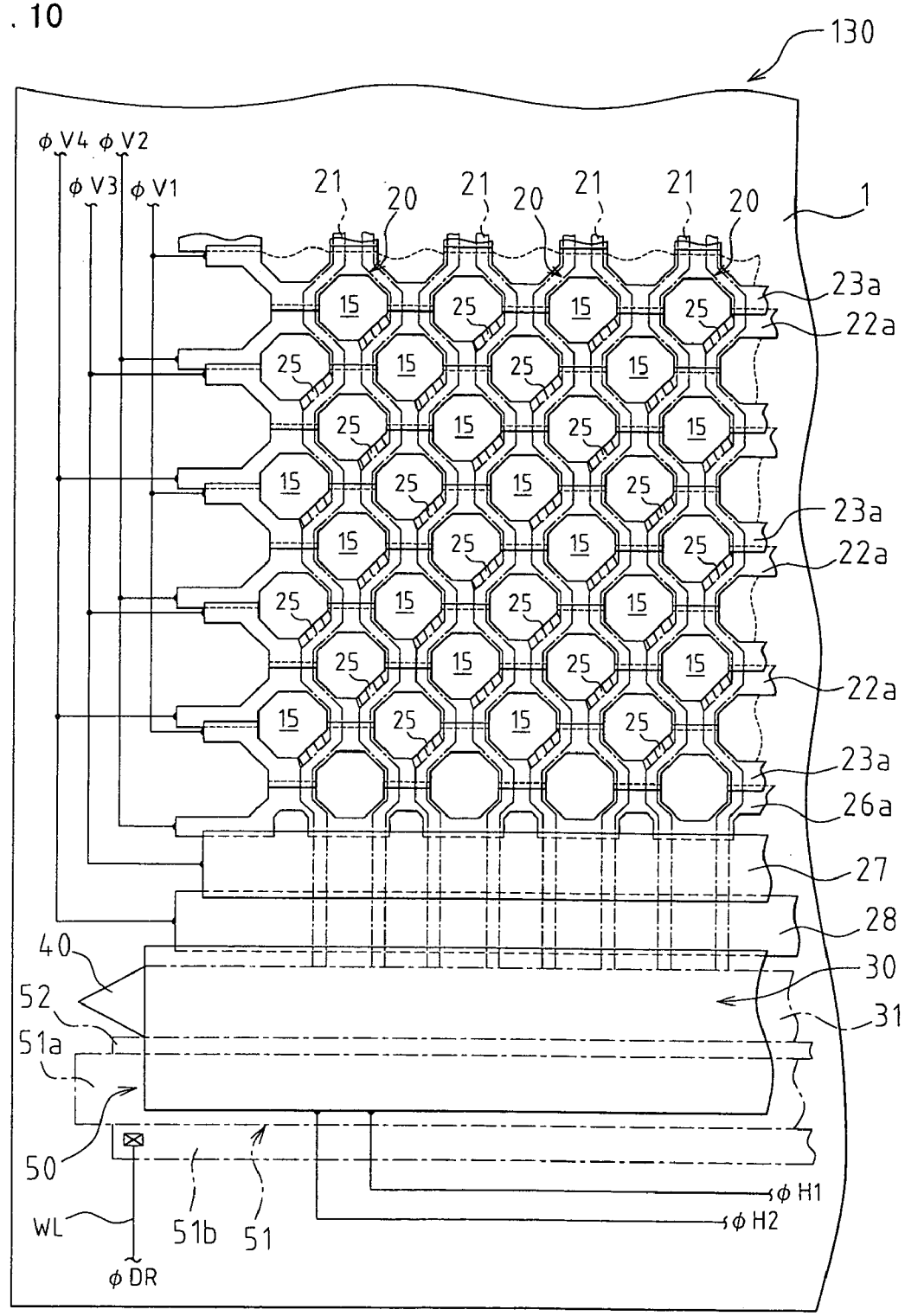
FIG. 10 is a schematic partial plan view showing a solid state image pickup device according to a fourth embodiment.

FIG. 10 is a schematic partial plan view showing the solid state image pickup device 130 according to the fourth embodiment. In FIG. 9, constituent members are omitted which are disposed above a semiconductor substrate at the upper level than a light shielding layer or a protective layer to be described later.

The solid state image pickup device 130 shown in FIG. 10 is considerably different from the solid state image pickup device 100 of the first embodiment in that a number of photoelectric conversion elements 15 are disposed in a pixel shift layout.

The term "pixel shift layout" used in this specification means the layout of a number of photoelectric conversion elements in which each photoelectric conversion element of each photoelectric conversion element column of the even column is shifted in the column direction by about a half of the pitch of photoelectric conversion elements in the photoelectric conversion element column from each photoelectric conversion element of each photoelectric conversion element column of the odd column, each photoelectric conversion element of each photoelectric conversion element row of the even row is shifted in the row direction by about a half of the pitch of photoelectric conversion elements in the photoelectric conversion element row from each photoelectric conversion element of each photoelectric conversion element row of the odd row, and each photoelectric conversion element column includes only photoelectric conversion elements of the odd or even row. The "pixel shift layout" is one type of the layouts in which a number of photoelectric conversion elements are disposed in a matrix shape in rows and columns.

In the phrase "about a half of the pitch of photoelectric conversion elements in the photoelectric conversion element column", "about a half" means precisely a half as well as substantially a half although it is not correctly a half because of a manufacture error, a pixel position round error caused by design or mask manufacture, and the like, it can be assumed substantially a half in terms of the solid state image pickup device performance and image quality. This is also applied to the phrase "about a half of the pitch of photoelectric conversion elements in the photoelectric conversion element row".

In the solid state image pickup device 130 in which a number of photoelectric conversion elements are disposed in the pixel shift layout, first and second vertical transfer electrodes 22a and 23a and a first auxiliary transfer electrode 26a are disposed in a meshed pattern.

Each of the first and second vertical transfer electrodes 22a and 23a and the first auxiliary transfer electrode 26a extend, as a whole, along the photoelectric conversion element row although they extend in a zigzag way. Each vertical charge transfer element 20 has areas extending in a zigzag way along the corresponding photoelectric conversion element column.

The solid state image pickup device 130 shown in FIG. 10 has a similar structure to that of the solid state image pickup device 100 of the first embodiment, excepting: the layout of a number of photoelectric conversion elements 15; the shapes of the first and second vertical transfer electrodes 22a and 23a and the first auxiliary transfer electrode 26a; the shape of each vertical charge transfer element 20; the relative position of the vertical charge transfer element 20 and corresponding photoelectric conversion element column; and the positions of read gates 25.

Constituent elements shown in FIG. 10 having the functions common to those of the constituent elements shown in FIG. 1 are represented by identical reference symbols and the description thereof is omitted. However, a new reference symbol "22a" is affixed to the first vertical transfer electrode, a new reference symbol "23a" is affixed to the second vertical transfer electrode, and a new reference symbol "26a" is affixed to the first auxiliary transfer electrode.

Similar to the solid state image pickup device 100, the solid state image pickup device 130 has the discharge drain 50 so that advantageous effects similar to the solid state image pickup device 100 can be obtained.

Next, a solid state image pickup device according to a fifth embodiment will be described with reference to FIG. 11.

Figure 11:
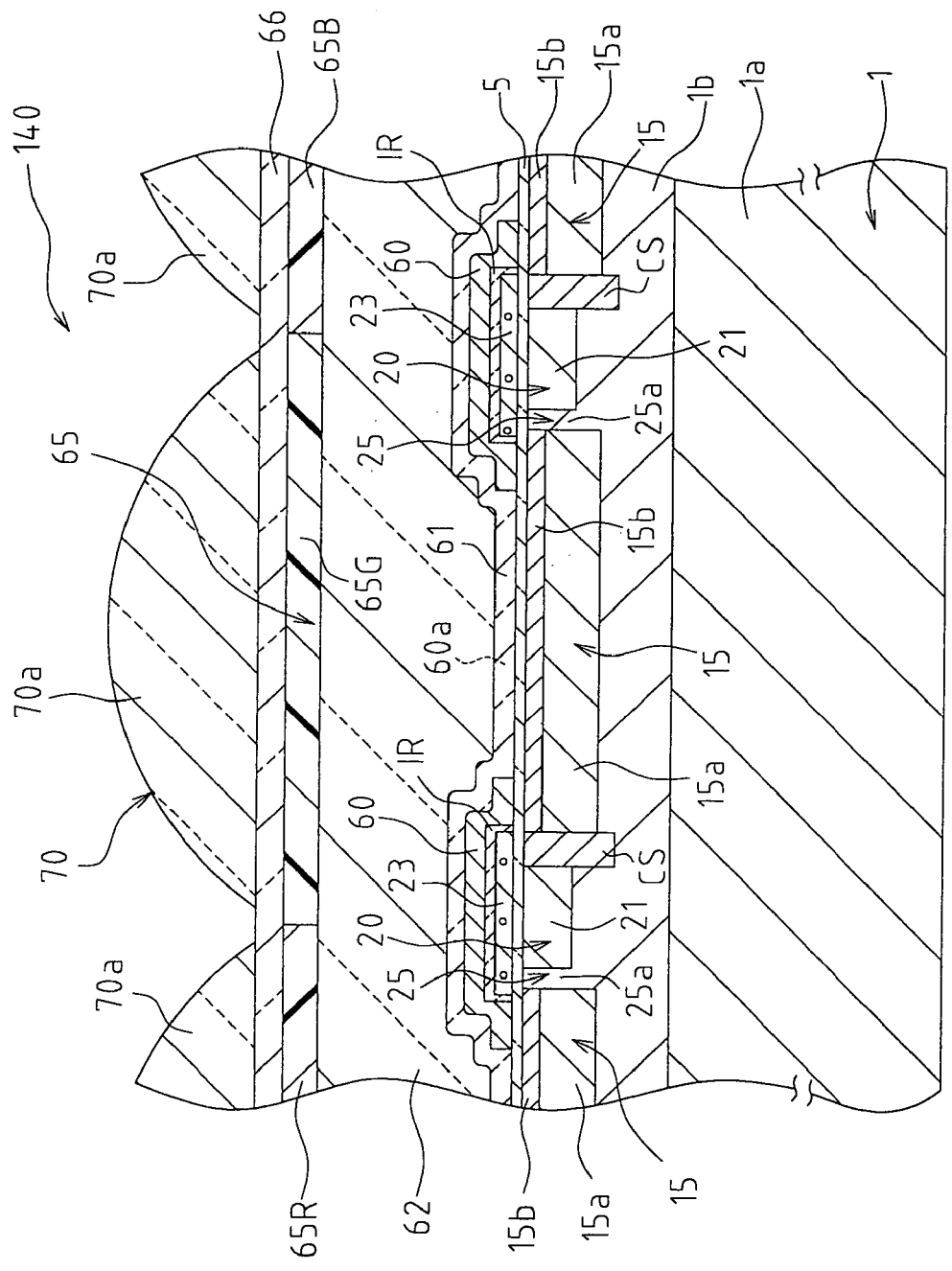
FIG. 11 is a schematic cross sectional view showing a photoelectric conversion element and its peripheral area of a solid state image pickup device according to a fifth embodiment.

FIG. 11 is a schematic cross sectional view showing a photoelectric conversion element and its peripheral area of the solid state image pickup device 140 according to the fifth embodiment. The solid state image pickup device 140 is used for color image pickup and can be manufactured by the process making use of the solid state image pickup device 100 of the first embodiment as a half-finished product.

In FIG. 11, a light shielding layer 60, a protective layer 61 and those constituent member disposed over the semiconductor substrate 1 at a level higher than the level of the light shielding layer 60 or the protective layer 61 are shown which were omitted in FIGS. 1, 7, 9 and 10. The sectional structure at the level lower than the light shielding layer 60 and protective layer 61 corresponds to the sectional structure of the solid state image pickup device 100 cut along the line XI-XI shown in FIG. 1. In FIG. 11, constituent elements common to those shown in FIG. 1 or 2 are represented by using identical reference symbols used in FIG. 1 or 2 and the description thereof is omitted.

As shown in FIG. 11, the photoelectric conversion element 15 is a buried-type photodiode manufactured by forming an n-type impurity doped region 15a in a predetermined area of a p-type impurity doped region 1b and forming a $p^+$-type impurity doped region 15b in the n-type impurity doped region 15a. The n-type impurity doped region 15a serves as the charge accumulation region.

The p-type impurity doped region 1b is in contact with the right edge as viewed in FIG. 11 of the photoelectric conversion element 15 (n-type impurity doped region 15a). This region of the p-type impurity doped region 1b is used as a read gate channel region 25a. Each read gate channel region 25a extends from approximately the center area of the right edge of the corresponding photoelectric conversion element 15 toward the downstream side, as viewed in plan. The read gate channel region 25a is interposed between the vertical charge transfer channel 21 and corresponding photoelectric conversion element 15.

The read gate channel region 25a and the second vertical transfer electrode 23 disposed on the first electrically insulating layer 5 above the read gate channel region 25a constitute one read gate 25.

A channel stopper region CS surrounds as viewed in plan each photoelectric conversion element 15 and each vertical charge transfer channel.21, excepting the area where the read gate channel region 21a is formed. The channel stopper region CS electrically isolates the photoelectric conversion elements 15 form each other, and the photoelectric conversion elements 15 from the vertical charge transfer channels 21. For example, the channel stopper region CS is formed by manufacturing a $p^+$-type impurity doped region in a predetermined area of the p-type impurity doped region 1b.

Each impurity doped region can be formed, for example, by ion implantation to be followed by annealing. The p-type impurity doped region 1b can also be formed, for example, by epitaxial growth.

In order to avoid unnecessary photoelectric conversion in an area other than the photoelectric conversion elements 15, the light shielding layer 60 covers the first electrically insulating layer 5 and various electrodes formed on the layer 5. The light shielding layer 60 has an opening 60a having a predetermined shape over each photoelectric conversion element 15 ($p^+$-type impurity doped region 15b). Each opening 60a positions inside the outer periphery of the n-type impurity doped region 15a of the associated photoelectric conversion element 15 as viewed in plan.

For example, the light shielding layer 60 is made of a thin layer of metal such as aluminum, chromium, tungsten, titanium and molybdenum, a thin layer of alloy of two or more of these metals, a multiple layer of a combination of two or more selected from a group including the metal thin layers and the alloy thin layers.

The protective layer 61 is formed on the light shielding layer 60 and on the first electrically insulating layer 5 exposed in the openings 60a, to thereby protect the underlying constituent members. For example, the protective layer 61 is made of silicon nitride, silicon oxide, PSG (phosphosilicate glass), BPSG (borophosphosilicate glass), polyimide or the like.

A first planarizing layer 62 covers the protective layer 61 to provide a flat surface on which a color filter array 65 is formed. The first planarizing layer 62 is also used as a focus adjustment layer for microlenses to be later described. If necessary, inner lenses are formed in the first planarizing layer 62.

For example, the first planarizing layer 62 is formed by coating transparent resin such as photoresist to a desired thickness by spin coating.

A color filter array 65 is formed on the first planarizing layer 62. The color filter array 65 includes a plurality of color filters being classified into several colors repetitiously arranged in a predetermined pattern for allowing color image pickup. A color filter array for color image pickup includes a primary color type color filter array and a complementary color type color filter array.

In both the primary color type color filter array and complementary color type color filter array, a color filter is disposed above each photoelectric conversion element 15. In FIG. 11, a red color filter 65R, a green color filter 65G and a blue color filter 65B are shown.

The color filter array 65 can be formed by forming color resin layers each containing pigment or dye of a desired color in desired areas by photolithography or the like.

A second planarizing layer 66 is formed on the color filter array 65 to provide a flat surface on which a microlens array 70 is formed. For example, the second planarizing layer 66 is formed by coating transparent resin such as photoresist to a desired thickness by spin coating or the like.

The microlens array 70 is formed on the second planarizing layer 66. The microlens array 70 is constituted of each micro lens 70a disposed above each photoelectric conversion element 15.

The microlenses 70a are formed, for example, by coating transparent resin (e.g., photoresist) having a refractive index of about 1.3 to 2.0, patterning it into a plurality of transparent resin sections by photolithography or the like, melting the sections by heat treatment to round the corners by surface tension, and then cooling them.

The solid state image pickup device 140 is a solid stage image pickup device for color image pickup and can be manufactured by the process making use of the solid state image pickup device 100 of the first embodiment as a half-finished product. Similar to the solid state image pickup device 100, the solid image pickup device 140 has the discharge drain 50 so that advantageous effects similar to the solid state image pickup device 100 can be obtained.

The solid state image pickup device and its driving method according to the embodiments have been described above. The invention is not limited only to the embodiments.

For example, although the vertical charge transfer elements of the embodiment are made of four-phase drive type CCD's, they may be made of three-phase, six-phase, eight-phase drive type CCD's or CCD's driven by drive signals having more phases.

One vertical charge transfer element may be provided for two photoelectric conversion element columns, or, for example, in a solid state image pickup device used as a linear image sensor, the charge transfer element may be disposed on both sides of each photoelectric conversion element column. In the latter case, for example, the odd photoelectric conversion elements of the photoelectric conversion element column are electrically connected to one charge transfer element, whereas the even photoelectric conversion elements are electrically connected to the other charge transfer element.

The number of vertical transfer electrodes per one photoelectric conversion element row can be selected as desired in accordance with a drive method and the like of the solid state image pickup device. If a number of photoelectric conversion elements are disposed in a square matrix shape (including different numbers of rows and columns), for example, two to three vertical transfer electrodes are formed for each photoelectric conversion element row. If a number of photoelectric conversion elements are disposed in the pixel shift layout, (N+1) vertical transfer electrodes are formed for N photoelectric conversion element rows, or for example, two to four vertical transfer electrodes are formed for each photoelectric conversion element row. The vertical charge transfer element may be formed without auxiliary transfer electrodes.

The method of driving the vertical charge transfer elements is not limited only to the driving method using interlace scanning. Depending upon the structure of a solid state image pickup device, an image pickup mode of a image pickup apparatus, and the like, the driving method may be selected as desired, such as ½ thinning scanning, ¼ thinning scanning, ⅛ thinning scanning, 1/16 thinning scanning, and progressive scanning.

Although the horizontal charge transfer element of the embodiment is made of two-phase drive type CCD, it may be made of three-phase drive type CCD or CCD driven by drive signals having four phases or more.

In the horizontal charge transfer channel, two units each constituted of a potential barrier region and a potential well region are provided for one vertical charge transfer element. Instead, one unit may be provided for one vertical charge transfer element. Although each unit is formed by regions having different effective impurity concentrations in the embodiment, it may be formed by regions having approximately the same effective impurity concentration if different voltages are applied to the regions through the horizontal transfer electrodes.

The barrier region may have a conductivity type opposite to that of the horizontal charge transfer channel.

In the embodiment solid state image pickup device, each horizontal transfer electrode extends even to the upper surface of the second electrically insulating layer formed above the first drain region in order to supply the horizontal drive signal to each horizontal transfer electrode. It is not always necessary to extend each horizontal transfer electrode to the area above the first drain region.

In order to facilitate the connection between each horizontal transfer electrode and voltage supply lines for supplying the horizontal drive signals to the horizontal transfer electrodes, it is preferable to extend the horizontal transfer electrodes to the upper surface of the second electrically insulating layer formed above the first drain region.

The drain region may be one impurity-doped region having generally a uniform effective impurity concentration.

In the embodiment solid state image pickup device, electrons are transferred as charges. A solid state image pickup device of the type that holes are transferred as charges may also be used. In this case, the conductivity type of each region is reversed from a p-type to an n-type and vice versa.

It is preferable to form a light shielding layer for a solid state image pickup device for color image pickup. In a single-plate type solid state image pickup device for color image pickup, a color filter array is provided. Although the microlens array may be omitted, it is preferable to form it.

In a solid state image pickup device for black and white image pickup, a light shielding layer and a microlens array can be omitted. Although the color filter array is not necessarily required to be formed, a monochromatic (including achromatic and transparent) color filter array or a monochromatic (including achromatic and transparent) layer replacing a color filter array may be used if necessary.

The color filter array of a single-plate type solid state image pickup device for color image pickup is not limited only to a primary color type color filter array, but it may be a complementary color type color filter array.

As a layout pattern of color filters of a primary color type color filter array, many patterns are known such as a Bayer type, an interline type, a G strip RB checkerboard type, a G stripe RB perfect checkerboard type, a stripe type, and an oblique stripe type. By rotating these layout patterns by about 40 degrees in a horizontal plane, primary color type color filter arrays can be formed which are applicable to a solid state image pickup device having a number of photoelectric conversion elements disposed in the pixel shift layout.

As a layout pattern of color filters of a complementary color type color filter array, many patterns are known such as a field color-difference sequential type, a frame color-difference sequential type, a MOS type, an improved MOS type, a frame interleave type, a field interleave type, and a stripe type. By rotating these layout patterns by about 40 degrees in a horizontal plane, complementary color type color filter arrays can be formed which are applicable to a solid state image pickup device having a number of photoelectric conversion elements disposed in the pixel shift layout.

A solid image pickup device is not limited only to an interline transfer type, but it may be a full frame type, a frame transfer type, a frame interline transfer type, an all-pixel read type or the like.

It is apparent that various modifications, improvements, combinations, and the like can be made by those skilled in the art.

As described so far, according to the invention, a solid state image pickup device can be provided which is capable of draining unnecessary charges without transferring them from the horizontal charge transfer element to the output unit and easy to improve productivity.

Accordingly, the invention facilitates to provide an image pickup apparatus capable of acquiring data necessary for performing the function such as AE, AF and digital zoom in a short time and with a low consumption power.

What we claim are:

1. A solid state image pickup device, comprising:
   a semiconductor substrate;
   a plurality of vertical charge transfer elements formed in one surface of said semiconductor substrate, each having (i) a vertical charge transfer channel having a first conductivity type and (ii) a plurality of vertical transfer electrodes formed on a first electrically insulating layer formed on the one surface of said semiconductor substrate, the vertical transfer electrodes traversing the vertical charge transfer channels as viewed in plan;
   a plurality of photoelectric conversion elements formed in the one surface of said semiconductor substrate in a matrix shape in rows and columns, each of said photoelectric conversion elements being electrically connectable to corresponding one of said vertical charge transfer elements;
   a horizontal charge transfer element formed in the one surface of said substrate and being electrically connectable to each of said vertical charge transfer elements, said horizontal charge transfer element having (i) a horizontal charge transfer channel having the first conductivity type and (ii) a plurality of horizontal transfer electrodes formed on the first electrically insulating layer formed on the one surface of said semiconductor substrate, each horizontal transfer electrode traversing the horizontal charge transfer channel as viewed in plan;
   a drain region formed in the one surface of said semiconductor substrate along the horizontal charge transfer channel, at a side thereof opposite the vertical charge transfer channel, said drain region having the first conductivity type; and
   an outside barrier region for charge formed between the horizontal charge transfer channel and said drain region, wherein the horizontal charge transfer channel, said drain region and said outside barrier region constitute a two-electrode element;
   wherein the horizontal charge transfer channel includes a potential barrier region and a potential well region alternately and repetitively disposed in this order from an upstream side to a downstream side, the potential barrier region having a relatively low effective impurity concentration and the potential well region having a relatively high effective impurity concentration, and a width of the potential well region as viewed in plan gradually or stepwise broadens toward said outside barrier region such that a gradient potential is formed that accelerates electrons toward the outside barrier region.

2. The solid state image pickup device according to claim 1, wherein a sum of the widths of an adjacent potential barrier region and potential well region is constant from one side edge to another side edge of the horizontal charge transfer channel.

3. The solid state image pickup device according to claim 2, wherein the potential well region is generally perpendicular to the side edges of the horizontal charge transfer channel.

4. The solid state image pickup device according to claim 2, wherein the potential well region bulges on both sides toward the outside barrier region.

5. A solid state image pickup device, comprising:
   a semiconductor substrate;
   a plurality of vertical charge transfer elements formed in one surface of said semiconductor substrate, each having (i) a vertical charge transfer channel having a first conductivity type and (ii) a plurality of vertical transfer electrodes formed on a first electrically insulating layer formed on the one surface of said semiconductor substrate, the vertical transfer electrodes traversing the vertical charge transfer channels as viewed in plan;
   a plurality of photoelectric conversion elements formed in the one surface of said semiconductor substrate in a matrix shape in rows and columns, each of said photoelectric conversion elements being electrically connectable to corresponding one of said vertical charge transfer elements;
   a horizontal charge transfer element formed in the one surface of said substrate and being electrically connectable to each of said vertical charge transfer elements, said horizontal charge transfer element having (i) a horizontal charge transfer channel having the first conductivity type and (ii) a plurality of horizontal transfer electrodes formed on the first electrically insulating layer formed on the one surface of said semiconductor substrate, each horizontal transfer electrode traversing the horizontal charge transfer channel as viewed in plan;
   a drain region formed in the one surface of said semiconductor substrate along the horizontal charge transfer channel, said drain region having the first conductivity type; and
   an outside barrier region for charge formed between the horizontal charge transfer channel and said drain region, wherein the horizontal charge transfer channel, said drain region and said outside barrier region constitute a two-electrode element;
   wherein:
   the horizontal charge transfer channel includes a potential barrier region and a potential well region alternately and repetitively disposed in this order from an upstream side to a downstream side, the potential barrier region having a relatively low effective impurity concentration and the potential well region having a relatively high effective impurity concentration;
   each of the horizontal transfer electrodes covers the potential well region or potential barrier region under the first electrically insulating layer and said outside barrier region under the first electrically insulating layer; and
   a width of each of the horizontal transfer electrodes covering the potential well region and said outside barrier region is broad above the potential well region and narrow above said outside barrier region.

6. The solid state image pickup device according to claim 5, wherein the horizontal transfer electrode above the potential well region has a constant width from one side edge to another side edge of the horizontal charge transfer channel.

* * * * *